(12) United States Patent
Tsuda et al.

(10) Patent No.: US 9,622,368 B2
(45) Date of Patent: Apr. 11, 2017

(54) SEMICONDUCTOR DEVICE

(75) Inventors: Ryo Tsuda, Tokyo (JP); Kazuhiro Morishita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 301 days.

(21) Appl. No.: 14/400,105

(22) PCT Filed: Aug. 24, 2012

(86) PCT No.: PCT/JP2012/071453
§ 371 (c)(1),
(2), (4) Date: Nov. 10, 2014

(87) PCT Pub. No.: WO2014/030254
PCT Pub. Date: Feb. 27, 2014

(65) Prior Publication Data
US 2015/0138733 A1 May 21, 2015

(51) Int. Cl.
*H01R 13/46* (2006.01)
*H05K 5/00* (2006.01)
(Continued)

(52) U.S. Cl.
CPC .......... *H05K 7/02* (2013.01); *H01L 23/04* (2013.01); *H01L 23/49811* (2013.01); *H01L 23/49838* (2013.01); *H01L 25/105* (2013.01); *H01L 25/115* (2013.01); *H01L 23/24* (2013.01); *H01L 23/3735* (2013.01); *H01L 24/73* (2013.01); *H01L 25/18* (2013.01); *H01L 2224/0603* (2013.01);
(Continued)

(58) Field of Classification Search
CPC .......... H05K 7/02; H05K 1/0263; H01L 2924/1305; H01L 2924/13055; H01L 2224/73265

USPC .......... 174/520; 361/733
See application file for complete search history.

(56) References Cited

U.S. PATENT DOCUMENTS 5,956,231 A * 9/1999 Yamada .......... H01L 23/049
257/678
6,313,598 B1 * 11/2001 Tamba .......... H01L 23/3107
257/692
(Continued)

FOREIGN PATENT DOCUMENTS

CN  201226385 Y  4/2009
JP  H02-154457 A  6/1990
(Continued)

OTHER PUBLICATIONS

Notification of Transmittal of Translation of the International Preliminary Report on Patentability and Translation of Written Opinion of the International Searching Authority; PCT/JP2012/071453; issued on Mar. 5, 2015.
(Continued)

*Primary Examiner* — Timothy Thompson
*Assistant Examiner* — Rhadames J Alonzo Miller
(74) *Attorney, Agent, or Firm* — Studebaker & Brackett PC

(57) ABSTRACT

Each of semiconductor module includes a semiconductor chip, a case surrounding the semiconductor chip, and a main electrode connected to the semiconductor chip and led out to an upper surface of case. A connecting electrode is connected and fixed to the main electrodes of the adjacent semiconductor modules. The connecting electrode is formed only of a metal plate.

7 Claims, 8 Drawing Sheets

(51) Int. Cl.
*H05K 7/02* (2006.01)
*H01L 23/498* (2006.01)
*H01L 25/11* (2006.01)
*H01L 23/04* (2006.01)
*H01L 25/10* (2006.01)
*H01L 25/18* (2006.01)
*H05K 1/02* (2006.01)
*H01L 23/373* (2006.01)
*H01L 23/24* (2006.01)
*H01L 23/00* (2006.01)

(52) U.S. Cl.
CPC ............ *H01L 2224/32225* (2013.01); *H01L 2224/48227* (2013.01); *H01L 2224/49175* (2013.01); *H01L 2224/73265* (2013.01); *H01L 2924/1305* (2013.01); *H01L 2924/13055* (2013.01); *H01L 2924/13091* (2013.01); *H01L 2924/30107* (2013.01); *H05K 1/0263* (2013.01)

(56) References Cited

U.S. PATENT DOCUMENTS

| | | | |
|---|---|---|---|
| 6,434,008 B1* | 8/2002 | Yamada | H01L 23/049 |
| | | | 174/255 |
| 2002/0062973 A1* | 5/2002 | Yamada | H01L 23/24 |
| | | | 174/59 |
| 2003/0067749 A1* | 4/2003 | Tamba | H05K 7/20927 |
| | | | 361/699 |
| 2010/0295187 A1* | 11/2010 | Tsuruoka | H01L 23/24 |
| | | | 257/773 |
| 2010/0315786 A1* | 12/2010 | Ochi | H01L 23/3107 |
| | | | 361/709 |

FOREIGN PATENT DOCUMENTS

| | | |
|---|---|---|
| JP | H05-160337 A | 6/1993 |
| JP | H07-123738 A | 5/1995 |
| JP | H08-186193 A | 7/1996 |
| JP | 2000-082772 A | 3/2000 |
| JP | 2001-168278 A | 6/2001 |
| JP | 2002-170923 A | 6/2002 |
| JP | 2003-078107 A | 3/2003 |
| JP | 2010-186953 A | 8/2010 |
| JP | 2010-287737 A | 12/2010 |

OTHER PUBLICATIONS

International Search Report; PCT/JP2012/071453; Nov. 27, 2012.
An Office Action issued by the Chinese Patent Office on Dec. 1, 2016, which corresponds to Chinese Patent Application No. 201280075360.7 and is related to U.S. Appl. No. 14/400,105; with English language partial translation.

* cited by examiner

SEMICONDUCTOR DEVICE

TECHNICAL FIELD

The present invention relates to a power semiconductor device used for motor control, for example, in electric railway use, on industrial equipment, or on consumer equipment.

BACKGROUND ART

It is necessary for semiconductor manufacturers to determine, for example, a rated current, a rated voltage and a circuit configuration in designing a semiconductor device according to use of the semiconductor device and to provide parts and perform manufacture management according to a lineup of various semiconductor devices. Simultaneously, users are required to make preparations for and management of semiconductor devices for pieces of equipment. A semiconductor device has a number of semiconductor chips mounted therein. When even only one of the semiconductor chips is broken, a need arises to replace the entire device because it is difficult to make internal repairs in the device. The unit price of a semiconductor chip using SiC in particular is higher than that of an Si chip and replacement of the entire devices means a large loss. There has been such a high-cost problem. To cope with this, a semiconductor device in which two semiconductor modules are connected by a wiring bus bar has been provided (see, for example, Patent Literature 1).

CITATION LIST

Patent Literature

Patent Literature 1: Japanese Patent Laid-Open No. 2000-082772

SUMMARY OF INVENTION

Technical Problem

With the conventional semiconductor device, however, there is a problem of an increase in the number of component parts and an increase in the entire size of the semiconductor device because of the use of a wiring bus bar.

The present invention has been achieved to solve the above-described problem and an object of the present invention is to provide a semiconductor device capable of reducing the cost and the number of component parts and being reduced in size.

Means for Solving the Problems

A semiconductor device according to the present invention includes: first and second semiconductor modules, wherein each of the first and second semiconductor modules includes a semiconductor chip, a case surrounding the semiconductor chip, and a main electrode connected to the semiconductor chip and led out to an upper surface of case; and a connecting electrode connected and fixed to the main electrodes of the first and second semiconductor modules, wherein the connecting electrode is formed only of a metal plate.

Advantageous Effects of Invention

The present invention makes it possible to reduce the cost and the number of component parts and enable reduction of the device in size.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
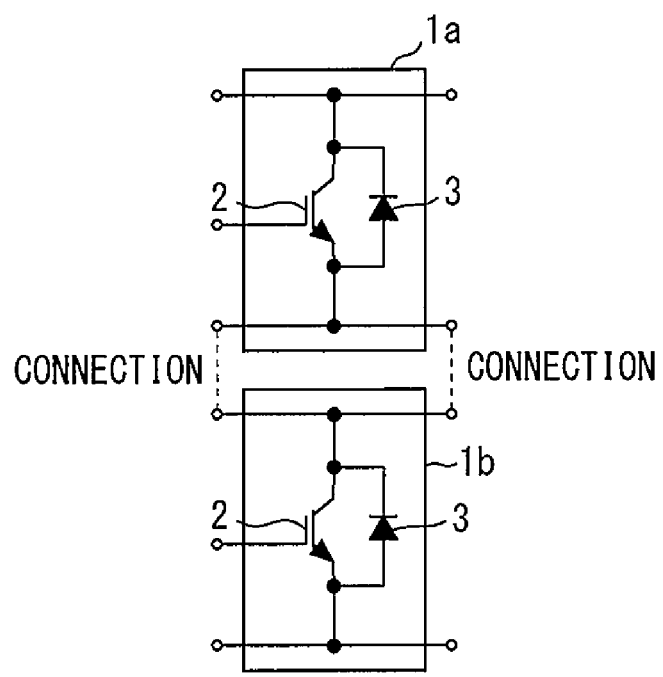
FIG. 1 is a circuit diagram showing a semiconductor device according to Embodiment 1 of the present invention.

FIG. 1 is a circuit diagram showing a semiconductor device according to Embodiment 1 of the present invention. Two semiconductor modules 1a and 1b are connected in series to each other. Each of the semiconductor modules 1a and 1b has an IGBT 2 (Insulated Gate Bipolar Transistor) 2 and an FWD 3 (Free Wheeling Diode) connected in parallel with each other.

Figure 2:
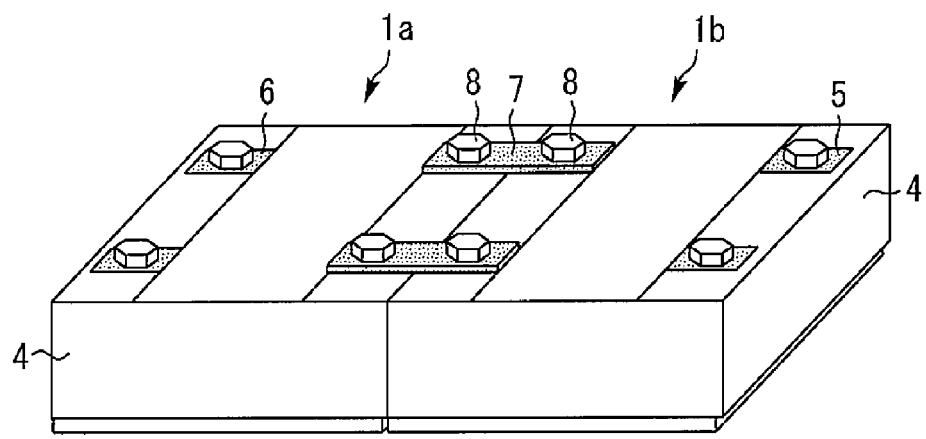
FIG. 2 is a perspective view showing the semiconductor device according to Embodiment 1 of the present invention.

FIG. 2 is a perspective view showing the semiconductor device according to Embodiment 1 of the present invention. A collector main electrode 5 and an emitter main electrode 6 of the semiconductor modules 1a and 1b are led out to upper surfaces of cases 4. The collector main electrode 5 and the emitter main electrode 6 are connected to an external circuit or an adjacent semiconductor module. A connecting electrode 7 formed only of an electrically conductive plate made of Al or Cu is connected and fixed to another collector main electrode 5 of the semiconductor module 1a and another emitter main electrode 6 of the semiconductor module 1b with bolts 8, thereby electrically connecting the two main electrodes to each other and fixing the semiconductor modules 1a and 1b to each other.

Figure 3:
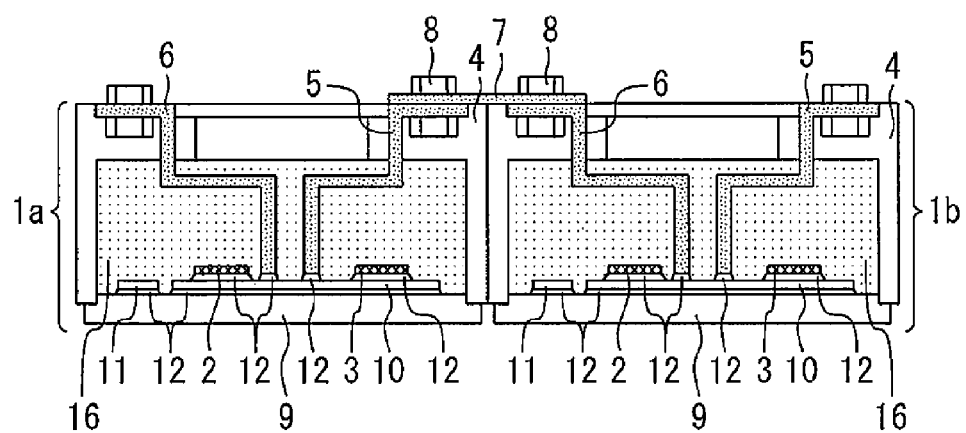
FIG. 3 is a sectional view showing the semiconductor device according to Embodiment 1 of the present invention.
Figure 4:
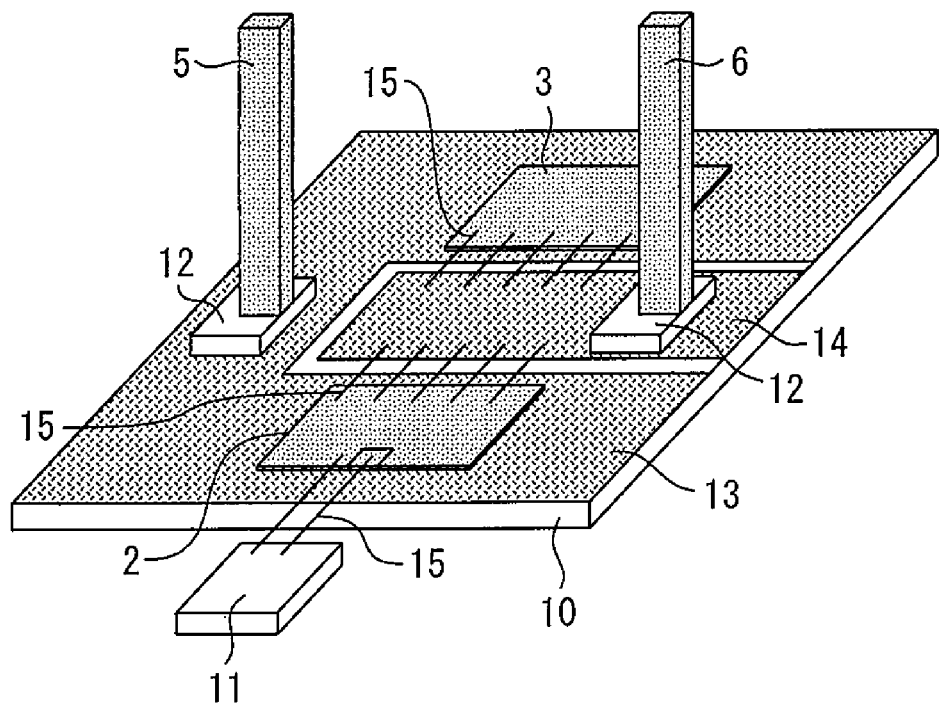
FIG. 4 is a perspective view showing inner portions of the semiconductor module according to Embodiment 1 of the present invention.

FIG. 3 is a sectional view showing the semiconductor device according to Embodiment 1 of the present invention. FIG. 4 is a perspective view showing inner portions of the semiconductor module according to Embodiment 1 of the present invention. An insulating substrate 10 and a drive substrate 11 are mounted on a base plate 9 with solder 12 interposed therebetween. The insulating substrate 10 is made of AlN, which is a material having a high insulating property and high heat conductivity. The IGBT 2 and the FWD 3, which are semiconductor chips, are mounted on the insulating substrate 10.

Metal platings 13 and 14 are provided on the insulating substrate 10. A collector electrode of the IGBT 2 and a cathode electrode of the FWD 3 are joined to the metal plating 13 by solder 12. An emitter electrode of the IGBT 2 and an anode electrode of the FWD 3 are connected to the metal plating 14 by wires 15. The collector main electrode 5 and the emitter main electrode 6 are connected to the metal platings 13 and 14, respectively, by solder 12.

A gate electrode of the IGBT 2 is connected to the drive substrate 11 by wires 15. The drive substrate 11 is led out to the outside of the module through a metal electrode or a special-purpose substrate. The drive substrate 11 has a resistor connected between the gate electrode of the IGBT 2 and a gate drive circuit. With this resistor, operating variation between chips caused when a multiplicity of IGBTs 2 are connected in parallel with each other can be reduced.

The case 4 surrounds the IGBT 2, the FWD 3 and the other components. The IGBT 2, the FWD 3 and the other components are encapsulated in an encapsulating material 16 such as a resin. The connecting electrode 7 is connected and fixed to the collector main electrode 5 of the semiconductor module 1a and the emitter main electrode 6 of the semiconductor module 1b by inserting the bolts 8 in nuts on the case 4 side and fastening the bolts 8.

In the present embodiment, as described above, the collector main electrode 5 of the semiconductor module 1a and the emitter main electrode 6 of the semiconductor module 1b are connected to each other by using the connecting electrode 7. The rated current, the rated voltage and the circuit configuration, for example, can easily be changed by changing the connection using the connecting electrode 7, thus enabling reduction of the design time and facilitating manufacture management. Only a malfunctioning one of the semiconductor modules 1a and 1B may be replaced. There is, therefore, no need to replace the entire device. As a result, a reduction in cost can be achieved. In the present embodiment, the connecting electrode 7 is formed of an electrically conductive plate and, therefore, enables reduction of the number of component parts and reduction of the device in size in comparison with the conventional wiring bus bar.

Figure 5:
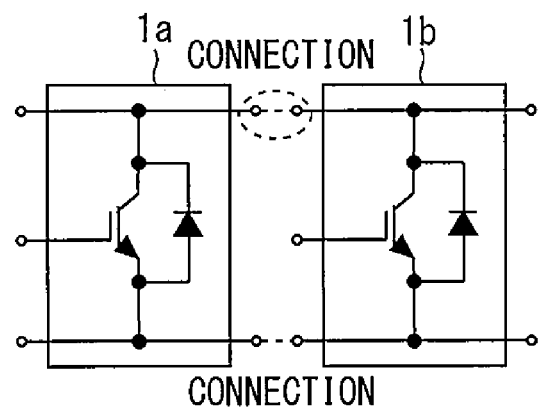
FIG. 5 is a circuit diagram showing Modified Example 1 of the semiconductor device according to Embodiment 1 of the present invention.
Figure 6:
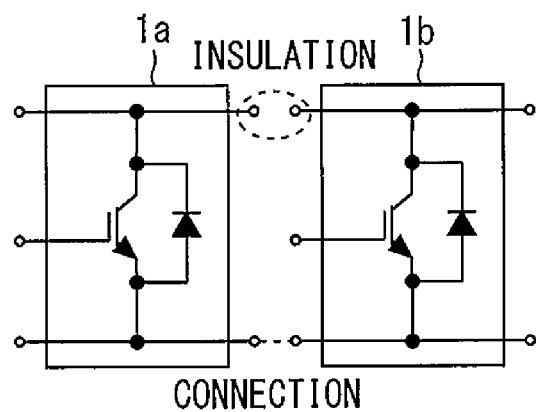
FIG. 6 is a circuit diagram showing Modified Example 2 of the semiconductor device according to Embodiment 1 of the present invention.
Figure 7:
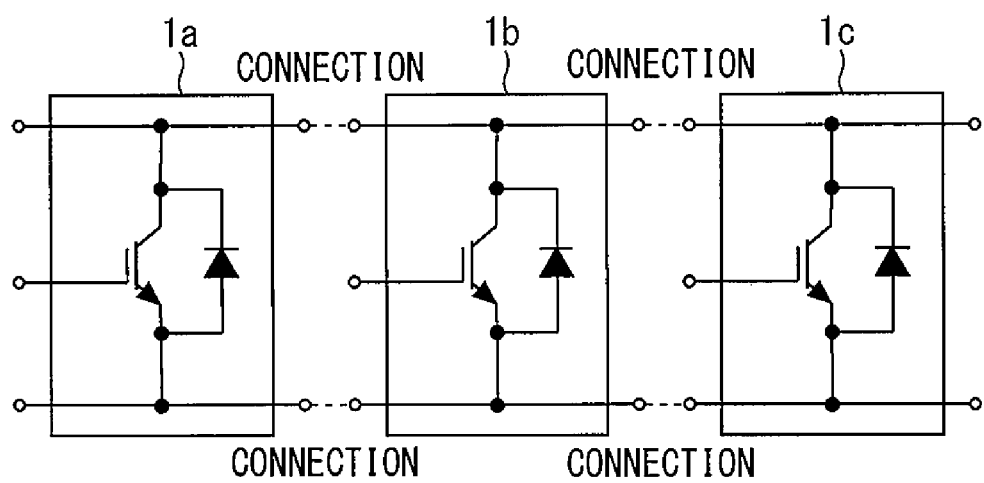
FIG. 7 is a circuit diagram showing Modified Example 3 of the semiconductor device according to Embodiment 1 of the present invention.

FIG. 5 is a circuit diagram showing Modified Example 1 of the semiconductor device according to Embodiment 1 of the present invention. Semiconductor modules 1a and 1b are connected in parallel with each other. FIG. 6 is a circuit diagram showing Modified Example 2 of the semiconductor device according to Embodiment 1 of the present invention. Collector main electrodes 5 of semiconductor modules 1a and 1b are insulated from each other. FIG. 7 is a circuit diagram showing Modified Example 3 of the semiconductor device according to Embodiment 1 of the present invention. Three semiconductor modules 1a, 1b, and 1c are connected in parallel with each other. Two or more semiconductor modules can thus be combined in series or parallel with each other.

Preferably, the upper surfaces of the collector main electrode 5 and the emitter main electrode 6 are flush with the upper surfaces of the cases 4. The current path is thereby made shorter to reduce the wiring inductance.

Embodiment 2

Figure 8:
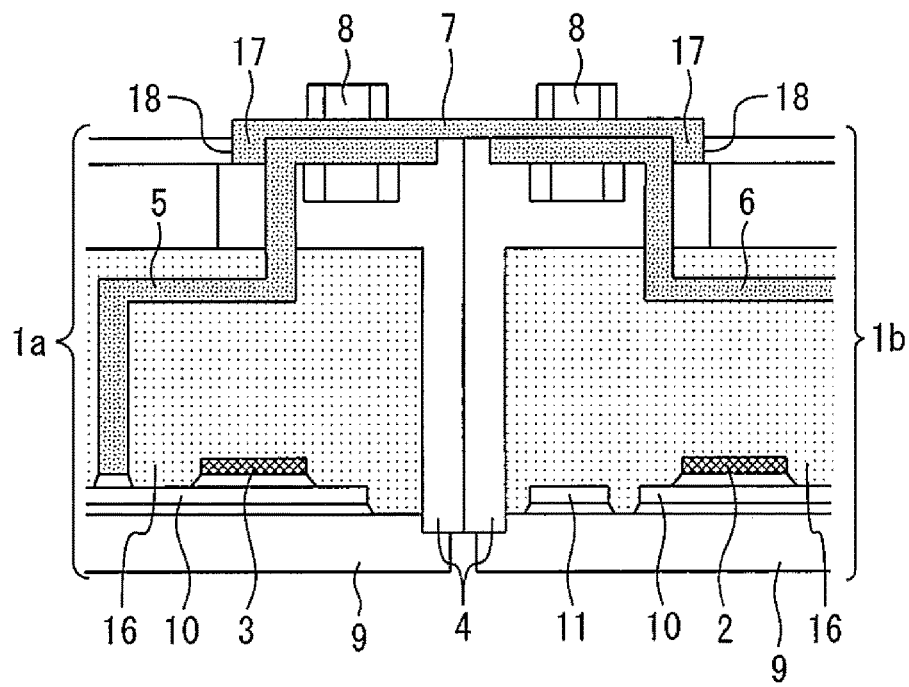
FIG. 8 is a sectional view showing a semiconductor device according to Embodiment 2 of the present invention.

FIG. 8 is a sectional view showing a semiconductor device according to Embodiment 2 of the present invention. The connecting electrode 7 is bent downward at its opposite ends to form hook portions 17. Grooves 18 in which the hook portions 17 can be caught are provided in the upper surfaces of the cases 4 of the semiconductor modules 1a and 1b, thereby facilitating positioning of the semiconductor modules 1a and 1b relative to each other.

Embodiment 3

Figure 9:
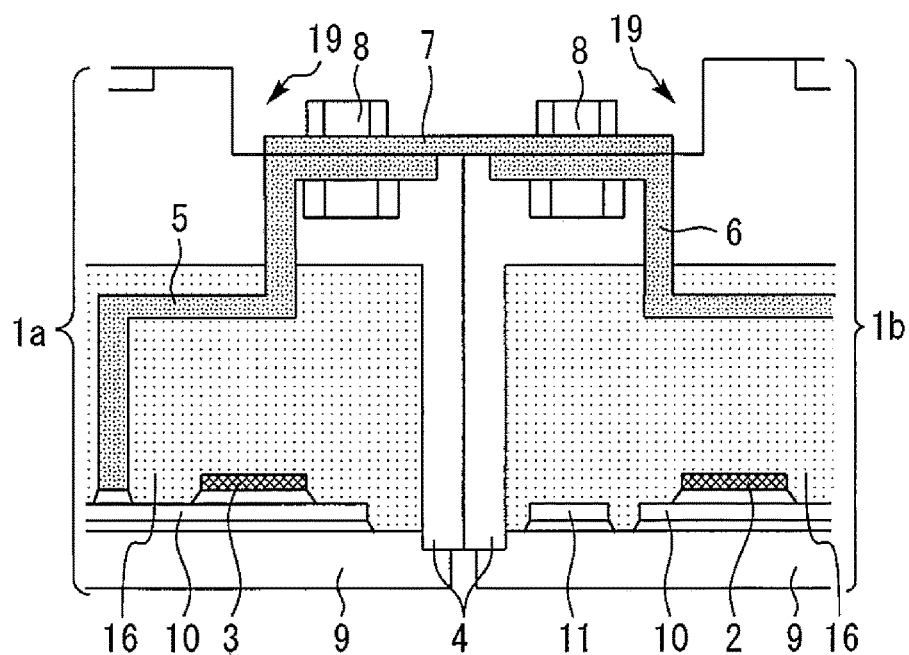
FIG. 9 is a sectional view showing a semiconductor device according to Embodiment 3 of the present invention.

FIG. 9 is a sectional view showing a semiconductor device according to Embodiment 3 of the present invention. Recesses 19 are provided in the upper surfaces of the cases 4. The collector main electrode 5 and the emitter main electrode 6 are led out to bottom surfaces of the recesses 19. In the recesses 19, the connecting electrode 7 is connected and fixed to the collector main electrode 5 and the emitter main electrode 6. The position at which the bolts 8 are mounted on the collector main electrode 5 and the emitter main electrode 6 is thus lowered. A certain insulation distance to an external device connected adjacent to the semiconductor device can thereby be secured, thus improving the insulation performance.

Embodiment 4

Figure 10:
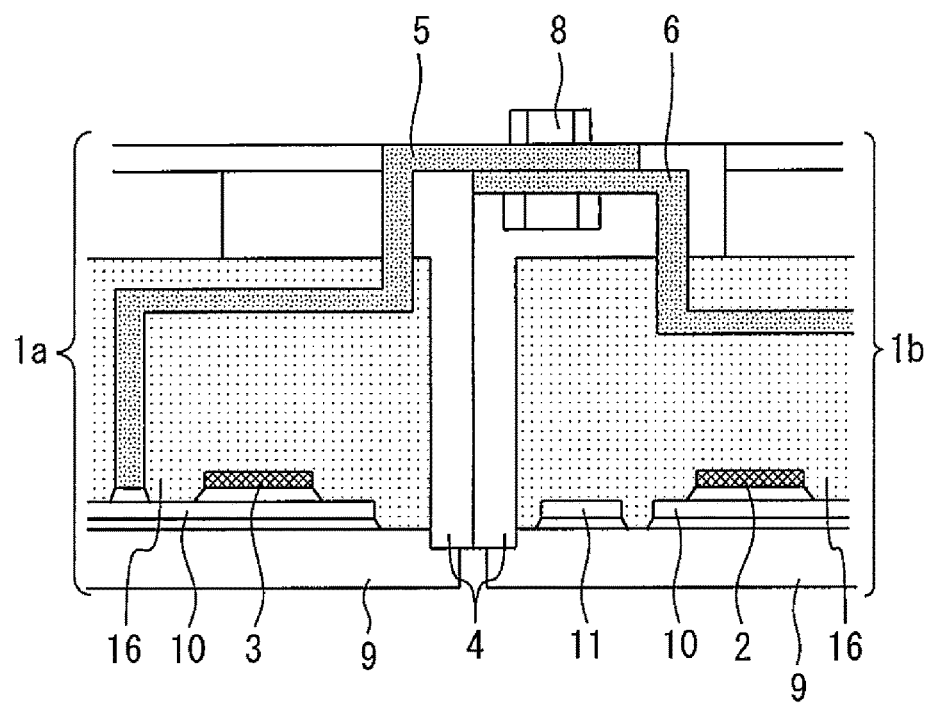
FIG. 10 is a sectional view showing a semiconductor device according to Embodiment 4 of the present invention.

FIG. 10 is a sectional view showing a semiconductor device according to Embodiment 4 of the present invention. The emitter main electrode 6 of the semiconductor module 1b is led out to the upper surface of the case 4 of the semiconductor module 1b. The collector main electrode 5 of the semiconductor module 1a is extended to a position above the case 4 of the semiconductor module 1b and connected and fixed to the emitter main electrode 6 of the semiconductor module 1b.

The main electrode of one of the semiconductor modules is thus provided with a connecting electrode function to eliminate the need for a separate connecting electrode for connection between the semiconductor modules. The method of making the connection at one position improves the working facility.

Embodiment 5

Figure 11:
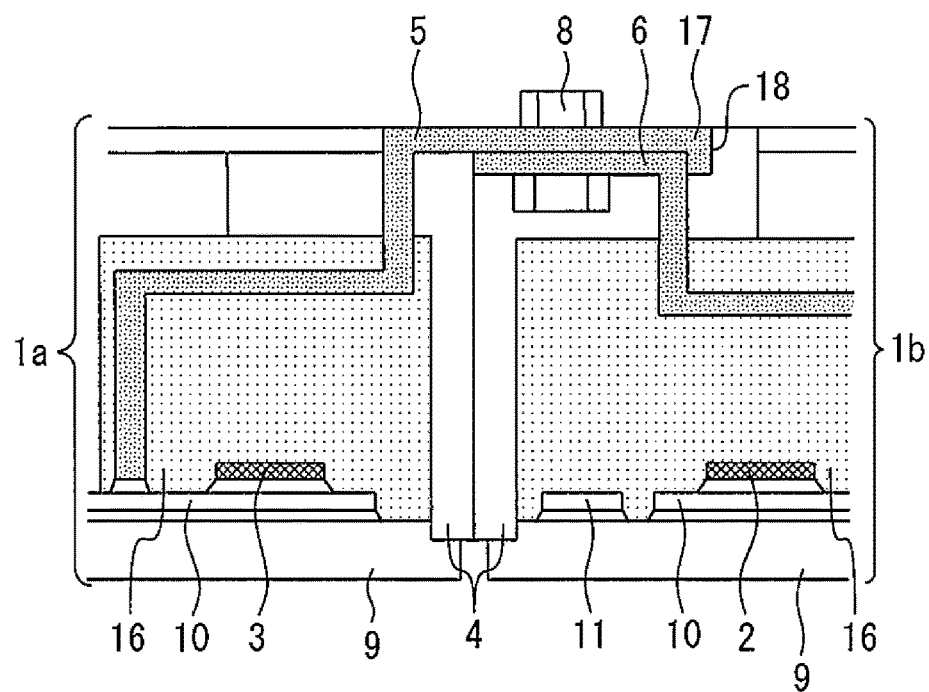
FIG. 11 is a sectional view showing a semiconductor device according to Embodiment 5 of the present invention.

FIG. 11 is a sectional view showing a semiconductor device according to Embodiment 5 of the present invention. A distal end of the collector main electrode 5 of the semiconductor module 1a is bent downward to form a hook portion 17. A groove 18 in which the hook portion 17 can be caught is provided in the upper surface of the case 4 of the semiconductor module 1b, thereby facilitating positioning of the semiconductor modules 1a and 1b relative to each other.

Embodiment 6

Figure 12:
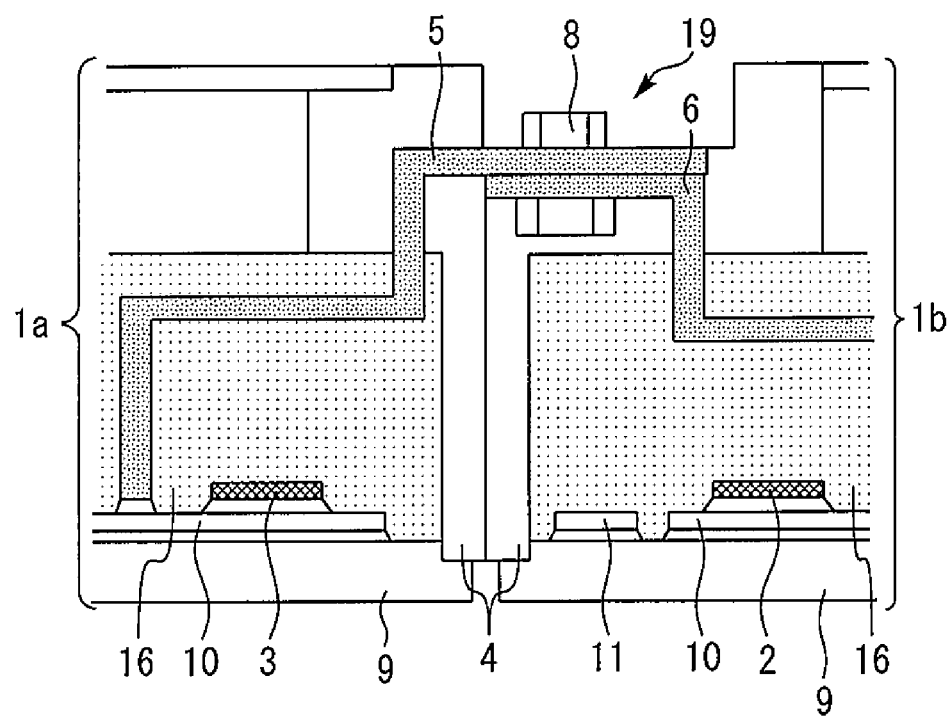
FIG. 12 is a sectional view showing a semiconductor device according to Embodiment 6 of the present invention.

FIG. 12 is a sectional view showing a semiconductor device according to Embodiment 6 of the present invention. A recess 19 is provided in the upper surface of the case 4 of the semiconductor module 1b. The emitter main electrode 6 of the semiconductor module 1b is led out to a bottom surface of the recess 19. In the recess 19, the collector main electrode 5 of the semiconductor module 1a and the emitter main electrode 6 of the semiconductor module 1b are connected and fixed to each other. The position at which the bolt 8 is mounted on the collector main electrode 5 and the emitter main electrode 6 is thus lowered. A certain insulation distance to an external device connected adjacent to the semiconductor device can thereby be secured, thus improving the insulation performance.

Embodiment 7

Figure 13:
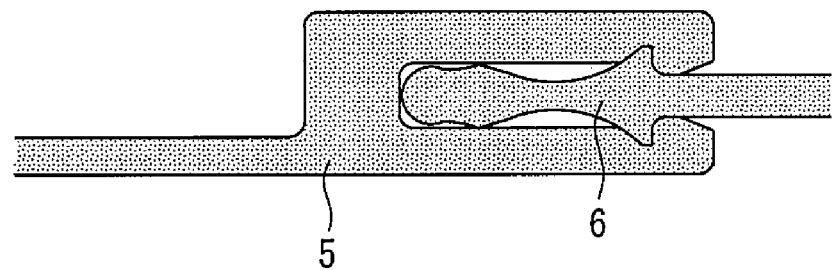
FIG. 13 is a top view showing a semiconductor device according to Embodiment 7 of the present invention.

FIG. 13 is a top view showing a semiconductor device according to Embodiment 7 of the present invention. In Embodiments 4 to 6, the collector main electrode 5 and the emitter main electrode 6 of the semiconductor modules 1a and 1b are connected by the bolt 8. In the present embodiment, the collector main electrode 5 and the emitter main electrode 6 of the semiconductor modules 1a and 1b form an insertion-type connection such that one of the electrodes is inserted in the other. The connection is thereby made easier and the working facility is improved.

Embodiment 8

Figure 14:
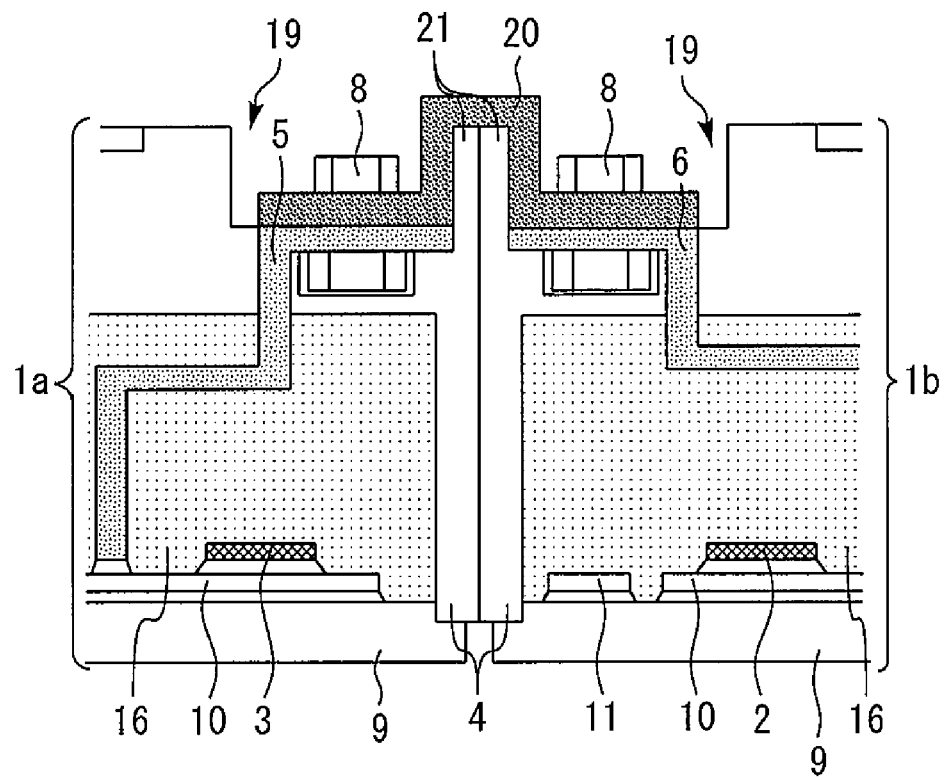
FIG. 14 is a sectional view showing a semiconductor device according to Embodiment 8 of the present invention.

FIG. 14 is a sectional view showing a semiconductor device according to Embodiment 8 of the present invention. An insulating member 20 is fixed to the collector main electrode 5 and the emitter main electrode 6 of the semiconductor modules 1a and 1b with bolts 8. Projections 21 are provided on outermost peripheral portions of the upper surfaces of the cases between the collector main electrode 5 and the emitter main electrode 6 of the semiconductor modules 1a and 1b. A creepage distance between the main electrodes can thus be increased in the connection not requiring electrical connection to improve the insulating property between the main electrodes.

In Embodiments 1 to 8, each of the semiconductor modules 1a and 1b has an Si-IGBT and an Si diode. However, the present invention is not limited to this. One of an Si-IGBT, an Si diode, an SiC-IGBT, an SiC-MOSFET and an SiC diode or a combination of some of these transistors and diodes may be used as a semiconductor chip. A semiconductor chip formed of SiCs has a high withstand voltage and a high allowable current density and can therefore be reduced in size. When this semiconductor device reduced in size is used, a semiconductor device incorporating the semiconductor chip can also be reduced in size. Also, the heat resistance of the semiconductor chip is high. Therefore, heat radiating fins of a heat sink can be reduced in size and it is possible to form an air cooling portion in place of a water cooling portion. As a result, the device can be further reduced in size. Also, the semiconductor chip has a smaller power loss and a higher efficiency, and the efficiency of the device can therefore be improved.

DESCRIPTION OF SYMBOLS

1a semiconductor module (first semiconductor module)
1b semiconductor module (second semiconductor module)
2 IGBT (semiconductor chip)
3 FWD (semiconductor chip)
4 case
5 collector main electrode (main electrode)
6 emitter main electrode (main electrode)
7 connecting electrode
17 hook portion
18 groove
19 recess
20 insulating member
21 projection

The invention claimed is:

1. A semiconductor device comprising:
   first and second semiconductor modules, wherein each of the first and second semiconductor modules includes a semiconductor chip, a case surrounding the semiconductor chip, and a main electrode connected to the semiconductor chip and led out to an upper surface of case; and
   a connecting electrode connected and fixed to the main electrodes of the first and second semiconductor modules,
   wherein the connecting electrode is formed only of a metal plate,
   opposite ends of the connecting electrode are bent downward to form hook portions, and
   grooves in which the hook portions are caught are provided in the upper surfaces of the cases of the first and second semiconductor modules.

2. The semiconductor device according to claim 1, wherein a recess is provided in the upper surface of the case,
   the main electrode is led out to a bottom surface of the recess, and
   the main electrode is connected and fixed to the connecting electrode in the recess.

3. The semiconductor device according to claims 1, wherein an upper surface of the main electrode is flush with the upper surface of the case.

4. A semiconductor device comprising first and second semiconductor modules,
   wherein each of the first and second semiconductor modules includes a semiconductor chip, a case surrounding the semiconductor chip, and a main electrode connected to the semiconductor chip and led out to an upper surface of case,
   the main electrode of the second semiconductor module is led out to the upper surface of case of the second semiconductor module, and
   the main electrode of the first semiconductor module is extended to a position above the case of the second semiconductor module and connected and fixed to the main electrode of the second semiconductor module,
   a distal end of the main electrode of the first semiconductor module is bent downward to form a hook portion, and
   a groove in which the hook portion is caught is provided in the upper surface of the case of the second semiconductor module.

5. The semiconductor device according to claim 4, wherein a recess is provided in the upper surface of the case of the second semiconductor module,
   the main electrode of the second semiconductor module is led out to a bottom surface of the recess, and
   the main electrode of the first semiconductor module is connected and fixed to the main electrode of the second semiconductor module in the recess.

6. The semiconductor device according to claim 4, wherein the main electrodes of the first and second semiconductor modules form an insertion-type connection such that one of the electrodes is inserted in the other.

7. A semiconductor device comprising:
   first and second semiconductor modules, wherein each of the first and second semiconductor modules includes a semiconductor chip, a case surrounding the semiconductor chip, and a main electrode connected to the semiconductor chip and led out to an upper surface of case; and
   an insulating member fixed to the main electrodes of the first and second semiconductor modules,
   wherein a projection is provided on the upper surface of the case between the main electrodes of the first and second semiconductor modules.

* * * * *